United States Patent [19]

Hsu

[11] 4,249,095
[45] Feb. 3, 1981

[54] COMPARATOR, SENSE AMPLIFIER

[75] Inventor: Sheng T. Hsu, Lawrenceville, N.J.

[73] Assignee: RCA Corporation, New York, N.Y.

[21] Appl. No.: 15,247

[22] Filed: Feb. 26, 1979

[51] Int. Cl.³ .................. H03K 17/56; H03F 3/45
[52] U.S. Cl. .................... 307/350; 307/DIG. 3; 307/239; 330/253
[58] Field of Search ........... 307/DIG. 3, 239, 350; 330/253

[56] References Cited

U.S. PATENT DOCUMENTS

| 3,520,190 | 7/1970 | Paine | 330/253 |
| 3,663,888 | 5/1972 | Greene | 330/253 |
| 3,676,702 | 7/1972 | McGrogan | 307/235 |
| 3,810,031 | 5/1974 | Poujois | 330/253 |
| 4,004,158 | 1/1977 | Morgan | 307/235 |
| 4,021,747 | 5/1977 | Todokoro | 330/253 |
| 4,021,751 | 5/1977 | Suzuki | 330/253 |
| 4,023,160 | 5/1977 | Kirshner | 340/347 |

Primary Examiner—Harold A. Dixon
Attorney, Agent, or Firm—E. M. Whitacre; P. J. Rasmussen; E. P. Herrmann

[57] ABSTRACT

A voltage comparator utilizing complementary MOS techniques. The comparator includes a pair of complementary field effect transistors with serial connected channels. A first signal to be compared is applied to the gate of one of the pair of transistors. A second signal is applied to the gate of the pair of transistors such that the transistor pair operates as a quasi-differential amplifier. The output of the transistor pair is subsequently amplified by a cross-coupled latch.

7 Claims, 2 Drawing Figures

COMPARATOR, SENSE AMPLIFIER

This invention relates to voltage comparators and in particular to comparators utilizing field effect transistors (FETs) integrable on a single integrated circuit array.

Present trends in digital signal processing have engendered a need for fast, low cost analog-to-digital and digital-to-analog converters. These two types of circuits are comprised of a combination of digital and analog circuitry, and usually include at least one voltage comparator. For circuits that utilize FET logic to perform the digital functions it is desirable to have a compatible comparator circuit so that the entire converter function can be integrated on a single monolithic die.

Previous FET comparator circuits use the technique of applying a reference potential to an input coupling capacitor of a high gain amplifier while simultaneously zeroing the amplifier, then selectively applying signal to the capacitor causing the amplifier to saturate in a high or low state, depending on whether the applied signal is greater or lesser than the reference potential; see U.S. Pat. No. 3,676,702 entitled, "Comparator Circuit", issued to E. P. McGrogan, Jr. The sensitivity and accuracy of this type of circuit is affected by the switching transients associated with alternately applying reference and signal voltages to charge the capacitor.

The present voltage comparator has a direct coupled input stage and includes a pair of complementary FET devices having their respective drain electrodes connected to a first circuit node and having their source electrodes separately connected so that each of the transistors operates as a common source amplifier. The first and second voltages to be compared are applied to the respective gate electrodes of the pair of FETs. The output voltage at the first circuit node is selectively applied to a latch circuit upon command of a digital switching pulse, the circuit gain of the latch circuit adding to the gain of the complementary amplifier to produce a comparator of relatively high sensitivity.

Figure 1:
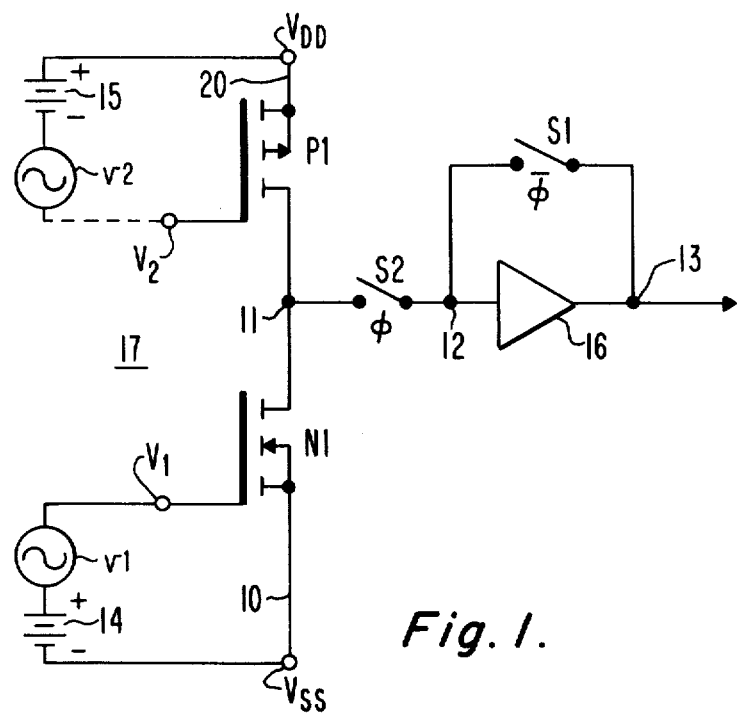
FIG. 1 is a combined schematic and block diagram of an embodiment of the invention.

Referring to FIG. 1, p-channel transistor P1 and n-channel transistor N1 form a quasi-differential amplifier 17 having a first input terminal V1, a second input terminal V2, and an output terminal at a first node 11 between the drain electrodes of P1 and N1. The signal available at node 11 is differentially related to a first voltage signal applied to V1 referenced to $V_{SS}$ and a second voltage signal applied to V2 referenced to $V_{DD}$. Amplifier 17 is referred to as quasi-differential in that common mode signals applied to terminals V1 and V2 produce an additive output signal rather than a difference output signal but which performs the difference function by applying an inverted input signal to one of its input terminals. Operation of amplifier 17 will be detailed more fully subsequently.

The amplifier output potential at node 11 is periodically sampled by switch S2 completing a conduction path between node 11 and terminal 12, the input electrode of amplifier 16. Amplifier 16 is a non-inverting amplifier with relatively high voltage gain characteristics, e.g., 1000, and which responds to the signal applied to its input at terminal 12 with an in-phase signal from its output to terminal 13. Amplifier 16 has an active gain region only for a narrowly determined range of input voltages. This range is arranged to include the output voltage amplifier 17 exhibits at node 11 for conditions when the relative values of inputs V1 and V2 are equal. Slight deviations of input potential at node 12 will cause amplifier 16, because of its high gain, to saturate or latch in a high or low state, depending on the direction of the potential swing.

The output signal at terminal 13 is selectively applied to input terminal 12 of amplifier 16 via switch S1 to complete a regenerative feedback loop around amplifier 16. The feedback tends to condition the amplifier to saturate, or latch, into a stable state wherein the output potential of 16 approaches the supply potentials applied to energize the amplifiers. As long as S1 remains closed the amplifier will remain in one state in which its output potential will be at its relatively positive or relatively negative limit and as such the circuit including 16 and S1 exhibits characteristics of a bistable circuit.

In normal operation S1 is closed and S2 open during the hold period, with terminal 13 providing for application to further circuitry, either a relatively high voltage or a relatively low voltage respectively associated with a separate one of two possible logic states, which logic state is determined by the relative magnitude of signal previously applied to V1 and V2. To sample, S1 is opened to prevent amplifier 16 from loading amplifier 17 and S2 is closed. Amplifier 16 begins to respond to the newly applied input signal and after its output potential has swung to a level closer to the final logic state for the new sample than to the alternative logic state, S1 is closed to speed up the transition.

A further switching alternative consists of opening switch S1 and closing S2 to sample then opening S2 prior to closing S1 to hold. This may be effected where there is sufficient capacitance associated with node 12 to store the sampled signal during the intervening period between S2 opening and S1 closing.

A third alternative would entail S1 and S2 alternatively opening and closing.

Switches S1 and S2 are normally not closed concurrently, although S1 may be closed concurrently with S2 after switch S2 has sampled the potential at node 11. Before closing S1, the output voltage of amplifier 16 at terminal 13 should be allowed to approach a potential commensurate with the newly sampled potential at input 12. A restriction on the concurrent closure of switches S1 and S2 is that output node 11 does not load the output of amplifier 16, otherwise, the system may be prevented from latching into a stable state.

Considering the construction of amplifier 17 more particularly, the channels of its enhancement mode FETs P1 and N1 are connected in series between the $V_{DD}$ and $V_{SS}$ supply potentials. Each of the transistors P1 and N1 is connected to operate as a common-source amplifier against the supply potential to which its source electrode is connected. P1 and N1 also function as active drain loads for each other, node 11 to which the drain electrodes connect to provide the output terminal of amplifier 17 exhibiting high output impedance since P1 and N1 are biased for linear operation.

Transistor P1 is a p-channel device which is conditioned to conduct current between its drain and source electrodes by applying a negative gate potential relative to its source potential and exceeding its turn-on or threshold potential $V_{TP}$. The supply potential $V_{DD}$ applied to the source electrode of P1 via terminal 20 is more positive than the other supply potential $V_{SS}$ (shown as ground potential) applied across the amplifier. Thus P1 will conduct for $V_{DD}-V_2>|V_{TP}|$, where V2 is the potential applied to input terminal V2.

Transistor N1 is an n-channel device which is conditioned to conduct current between its drain and source electrodes by applying a positive gate potential relative to its source potential and exceeding its turn-on or threshold potential $V_{TN}$.

Assuming that FETs P1 and N1 are matched devices, the output of amplifier 17 is proportional to the differential sum of the signal applied to terminal $V_1$ and a second signal which is inverted and level shifted by a potential $V_{DD}$ and applied to terminal $V_2$. In other words, to compare the difference between two positive-going signals, V1 and V2, the first, V1, is applied directly to terminal V1 which generates a drain-source current in N1 proportional to $V1-V_{TN}$. To generate a drain-source current proportional to positive-going signal V2 in P1, V2 must be referenced to $V_{DD}$ and caused to be negative-going, i.e., a d.c. component equal to $V_{DD}$ is added to V2 and the a.c. component of V2 is inverted so that the potential applied to terminal V2 is $V_{DD}-V2$. The gate-source potential of P1 is $(V_{DD}-V2)-V_{DD}=-V2$ which is the proper polarity to condition P1 to conduct and has a relative value equal to the original voltage.

For P1 and N1 matched, and for equal direct current gate-source potentials applied respectively to P1 and N1, equal drain-source current will flow in both FETs with the output potential at 11 obtaining a value of ½ $(V_{DD}-V_{SS})$. The small signal gain of the circuit, assuming the transconductance, $g_{mp}$, of the p-channel transistor and $g_{mn}$, of the n-channel transistor are equal to $g_m$, and also assuming that the common-source output impedance, $r_{op}$, of the p-channel device and $r_{on}$ of the n channel device are equal to $r_o$, can be shown to be ½ $g_m r_o$ with a resultant small signal output signal of ½ $g_m r_o$ (V2−V1).

Circuit applications where input signal excursions are less than the threshold potentials of the respective transistors require that the input gate electrodes be supplied with suitable d.c. bias potential, 14 and 15, to insure that P1 and N1 are biased into conduction. In addition, the gain of the input amplifier is subject to tailoring by means of the gate bias potential to permit adjustment of the quiescent output potential at node 11.

Figure 2:
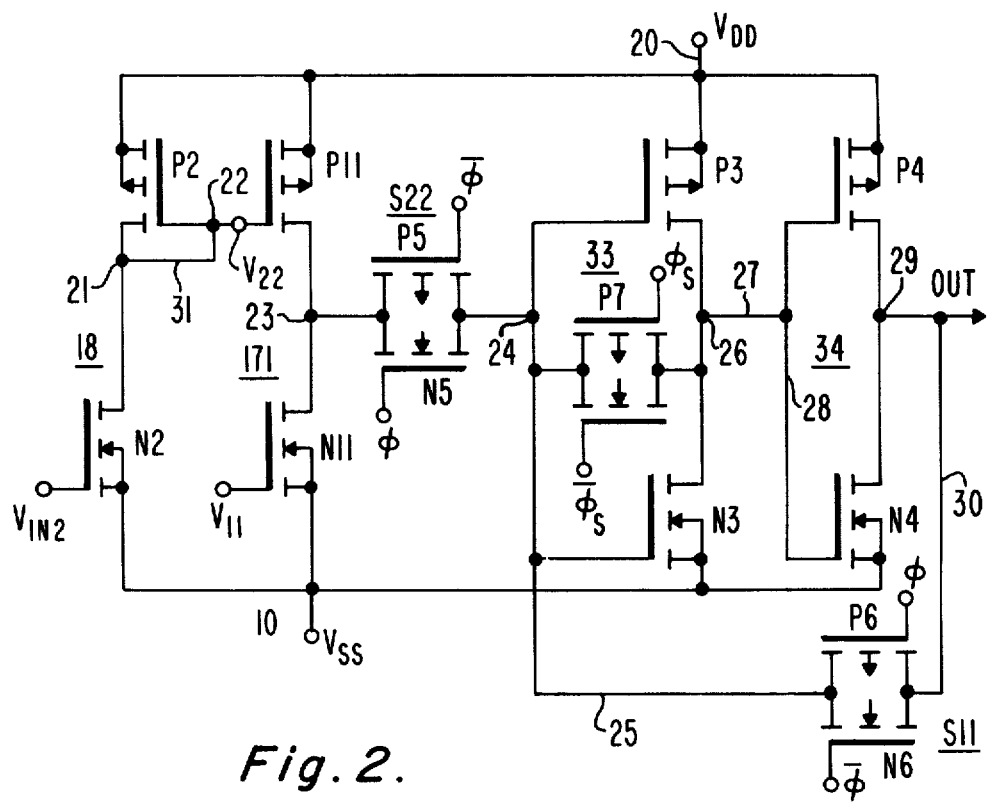
FIG. 2 is a schematic diagram of a particular embodiment of the invention.

The use of amplifier 17 is convenient where complementary signals are to be differentially compared in which case all that is required is that the signal applied to transistor P1 be level-shifted. However, where common-mode signals are to be compared additional circuitry is required to shift and invert the V2 input signal. One means of doing this is illustrated in FIG. 2. FETs P11 and N11 respectively correspond to P1 and N1 of the FIG. 1 circuit. The potential V22 applied to the gate electrode of P11 is provided by an inverting amplifier 18 comprised of FETs N2 and P2. However, in this configuration FETs P2 and P11 respectively form the master and slave transistors of a current mirror amplifier, or CMA. Drain-to-gate feedback connection 31 conditions P2 to conduct current applied to CMA input terminal 21 and generates a gate-source potential for P2 commensurate with the current conducted in its drain-source circuit. FET P11 having its gate interconnected to the gate of P2 at 22 receives the same gate-source potential. Since both P11 and P2 have like gate-source potentials the drain current ratio of P2:P11 is equal to the ratio of the channel geometries of the two devices. Matching FET P11 to P2 will condition P11 to conduct current equal to the current conducted by P2. The input current to P2 is the output or drain-source current of N2, thus the current sum at the output 23 of the amplifier 171 is $I_{N2}-I_{N1}$ where $I_{N2}$, $I_{N1}$ are respectively the drain-source currents of FETs N2 and N11. This current translates to an output potential equivalent to $A(-V_{in2}-V_1)$ given that N11, N2, P11, P2 are matched devices and "A" is the gain factor of amplifier 171 comprising transistor P11 and N11.

The FIG. 1 amplifier 16 may consist of two cascaded inverting amplifiers as exemplifed in FIG. 2 by amplifiers 33 and 34. FETs P3 and N3, having channels in series connection between supply terminals $V_{DD}$ and $V_{SS}$ and having a common input gate interconnection 24, embody a first inverting amplifier 33 known in the art (see RCA-CA3600 COS/MOS transistor ARRAY, *RCA Linear Integrated Circuits*, 1977). Output terminal 26 of amplifier 33 connects via interconnection 27 to the input terminal of a similar inverting amplifier 34 comprising series connected FETs P4 and N4, placing amplifiers 33 and 34 in direct coupled cascade. The circuit output, OUT, is taken from the output terminal 29 of inverting amplifier 34. A complementary output is available at terminal 26. Both of the amplifiers 33 and 34 can swing output potentials to within a few tenths of a volt from either $V_{DD}$ or $V_{SS}$, which swing is guaranteed when regenerative feedback is applied from output to input of the cascaded amplifiers. Provided $V_{DD}$ and $V_{SS}$ correspond to logic potentials the output potential at OUT will be switched to one or the other of these logic level values.

A switch S3 comprising complementary transistors P7 and N7 is included to selectively connect the input terminal of amplifier 33 to its output, to self-bias 33 near its operating mid point. This tends to balance amplifier 33 and also amplifier 34 provided amplifiers 33 and 34 are designed to have like operating characteristics. This balancing tends to improve the sensitivity of the circuit and also to speed up the transition at the output. S3 would nominally be open when S22 is closed and would be closed for a period just prior to S22 closing. Switch 11 may be open or closed during the period S3 is closed. Control of the switch is effected by complementary switch signals $\phi_S$ and $\overline{\phi}_S$. Switch S3 however is not essential to the circuit, and may be eliminated for specific applications where its inclusion becomes inconvenient.

The switches S11 and S22 correspond to switches S1 and S2 of the FIG. 1 circuit. These switches are realized by complementary transistor transmission gates P6, N6 and P5, N5 respectively. Transistors P5 and N5 are pulsed into conduction by respectively applying complementary clocked potentials $\overline{\phi}$ and $\phi$ having amplitudes of $V_{SS}$ and $V_{DD}$ concurrently to their respective gates. These potentials are of sufficient amplitude with respect to the relevant drain-source potentials to condition both P5 and N5 for bilateral conduction closing switch S22. Alternatively a gate potential of $V_{DD}$ applied to P5 and a gate potential of $V_{SS}$ applied concurrently to N5 will turn both transistors off causing S22 to open. In similar fashion P6 and N6 are turned on and off by application of complementary clock potentials $\phi$ and $\overline{\phi}$ to their gate electrodes.

Switches S11 and S22 may be realized with single transistors rather than complementary transistor pairs. Thus for example S11 and S22 may each comprise a single n-channel or single p-channel transistor. Where S11 and S22 are intended to be switched in complementary fashion, i.e., S11 closed when S22 open and vice versa, S11 may be a n-channel (p-channel) and S22 a p-channel (n-channel) device enabling both gates to be driven with a single control signal.

While in the foregoing the transistors operating as amplifying devices were referred to as enhancement mode devices the invention is not to be so restricted. The comparator may be constructed using depletion mode devices, enhancement mode devices or a combination of both. As such the scope of the claims is not to be limited to the specific embodiments described.

What I claim is:

1. A voltage comparator circuit comprising:
   first and second complementary field effect transistors having respective gate and drain and source electrodes;
   means connecting the respective drain electrodes of the first and second transistors to a first node;
   means for applying supply potential between the source electrodes of the first and second transistors;
   means for applying first and second voltages to be compared to the gate electrodes of the first and second transistors respectively;
   bistable circuit means having an input circuit for setting or resetting said bistable means without loading its input signal source; and
   means for selectively connecting the first node to the input circuit of said bistable circuit.

2. A voltage comparator circuit comprising:
   first and second transistors of complementary conductivity types each having respective output and common electrodes and a principal conduction path therebetween and having a respective input electrode, the principal conduction path being controlled by potential between the input and common electrodes;
   means connecting the respective output electrodes of the first and second transistors to a first node;
   means applying first and second supply potentials to the common electrodes of said first and second transistors, respectively, for conditioning said first and second transistors to conduct for potentials applied to their input electrodes within a range between the potentials applied to their common electrodes;
   non-inverting amplifier means having respective input and output terminals;
   first switch means for selectively connecting the output terminal of the amplifier to its input terminal;
   second switch means for selectively connecting the first node to the input terminal of the amplifier.

3. A comparator as set forth in claim 2 wherein the non-inverting amplifier means comprises:
   first and second inverting amplifier means each having respective input and output connections; and
   means connecting the first inverting amplifier in cascade with the second inverting amplifier;
   means connecting the input connection of the first inverting amplifier as the input terminal of the non-inverting amplifier; and
   means connecting the output connection of the second inverting amplifier as the output terminal of the non-inverting amplifier.

4. A comparator as set forth in claim 3 wherein each inverting amplifier comprises:
   a respective p-channel and a respective n-channel field effect transistor each having respective gate and drain and source electrodes;
   means connecting the respective drain electrodes of the respective p-channel and n-channel transistors to its respective amplifier output connection;
   means for applying supply potential between the source electrodes of the respective p-channel and n-channel transistors; and
   means connecting the respective gate electrodes of the respective p-channel and n-channel transistors to its respective amplifier input connection.

5. A comparator as set forth in claim 4 further comprising further switch means connecting the input connection of the first inverting amplifier to its output connection for selectively biasing the amplifier at its balance point during a time period that the second switch means is open.

6. A comparator as set forth in claims 2 or 3 or 4 or 5 wherein the first and second switch means each comprise:
   a p-channel and an n-channel field effect transistor pair, each transistor of said pair having respective drain and source electrodes and respective conduction channels therebetween and having respective gate electrodes;
   means connecting the conduction channels of the respective p-channel and n-channel transistors of each transistor pair in parallel; and
   means for applying complementary switching signals to the respective gate electrode of the transistors of each pair, said switching signals conditioning the first and second switch means for recurrant closure, thereof with each switch to close for a period to the exclusion of the other.

7. A comparator as set forth in claims 2 or 3 or 4 wherein the first switch means comprises:
   a further field effect transistor of one conductivity type having drain and source electrodes and a principal conduction path therebetween and having a gate electrode, potential between the gate and source electrode controlling the principal conduction path;
   and wherein the second switch means comprises a still further field effect transistor of conductivity type complementary to said one conductivity type, having drain and source electrodes and a principal conduction path therebetween, and having a gate electrode, potential between the gate and source electrode controlling the principal conduction path; and
   means connected to the gate electrodes of the transistors of said first and second switch means for applying a single recurrant switching potential to condition said transistors to conduct alternately.

* * * * *